(12) United States Patent
Mentze et al.

(10) Patent No.: US 7,112,995 B2
(45) Date of Patent: *Sep. 26, 2006

(54) LOW VOLTAGE TO HIGH VOLTAGE LEVEL SHIFTER AND RELATED METHODS

(75) Inventors: Erik J. Mentze, Moscow, ID (US);
Herbert L. Hess, Moscow, ID (US);
Kevin M. Buck, Pullman, WA (US);
David F. Cox, Tucson, AZ (US)

(73) Assignee: Idaho Research Foundation, Inc., Moscow, ID (US)

( * ) Notice: Subject to any disclaimer, the term of this patent is extended or adjusted under 35 U.S.C. 154(b) by 40 days.

This patent is subject to a terminal disclaimer.

(21) Appl. No.: 10/920,639

(22) Filed: Aug. 18, 2004

(65) Prior Publication Data
US 2005/0040854 A1 Feb. 24, 2005

Related U.S. Application Data

(60) Provisional application No. 60/499,059, filed on Aug. 22, 2003.

(51) Int. Cl.
*H03K 19/0175* (2006.01)
(52) U.S. Cl. .............................. 326/63; 326/81; 326/83
(58) Field of Classification Search ............ 326/63–68, 326/82–89
See application file for complete search history.

(56) References Cited

U.S. PATENT DOCUMENTS

| 5,684,415 | A | * | 11/1997 | McManus | 326/81 |
| 5,786,711 | A | * | 7/1998 | Choi | 326/83 |
| 5,896,045 | A | * | 4/1999 | Siegel et al. | 326/81 |
| 5,995,010 | A | * | 11/1999 | Blake et al. | 340/653 |
| 6,040,708 | A | * | 3/2000 | Blake et al. | 326/33 |
| 6,184,716 | B1 | * | 2/2001 | Depetro et al. | 326/83 |
| 6,487,687 | B1 | * | 11/2002 | Blake et al. | 714/724 |

* cited by examiner

*Primary Examiner*—Don Le
(74) *Attorney, Agent, or Firm*—Lee & Hayes, PLLC (57) ABSTRACT

A shifter circuit comprises a high and low voltage buffer stages and an output buffer stage. The high voltage buffer stage comprises multiple transistors arranged in a transistor stack having a plurality of intermediate nodes connecting individual transistors along the stack. The transistor stack is connected between a voltage level being shifted to and an input voltage. An inverter of this stage comprises multiple inputs and an output. Inverter inputs are connected to a respective intermediate node of the transistor stack. The low voltage buffer stage has an input connected to the input voltage and an output, and is operably connected to the high voltage buffer stage. The low voltage buffer stage is connected between a voltage level being shifted away from and a lower voltage. The output buffer stage is driven by the outputs of the high voltage buffer stage inverter and the low voltage buffer stage.

20 Claims, 6 Drawing Sheets

LOW VOLTAGE TO HIGH VOLTAGE LEVEL SHIFTER AND RELATED METHODS

RELATED APPLICATION

This application claims priority to U.S. Provisional Application Ser. No. 60/499,059, filed on Aug. 22, 2003, the disclosure of which is incorporated by reference.

GOVERNMENT SUPPORT

This invention was funded in part by the NASA Idaho EPSCoR under contract NCC5-577. The United States Government has certain rights in the invention.

TECHNICAL FIELD

This invention relates to voltage level shifters and, more particularly, to low voltage to high voltage level shifters.

BACKGROUND

Historically, the primary mode of reducing power consumption in electronic circuits has been to aggressively scale down the power supply voltage. This power supply reduction follows naturally for CMOS technologies sinceced Moore's Law scaling of processes into the nanometer range has resulted in gate oxide breakdown voltages on the order of 3.3 volts, 2.5 volts, 1.8 volts and lower. While effective in mitigating power consumption, this reduced breakdown voltage places significant limitations on the interconnection of these devices with other higher voltage systems. Such high voltage systems include 5 volt Legacy hardware and 28 volt aerospace hardware.

A typical solution to this problem is to add intermediate control circuitry between the integrated circuit and the external high voltage system. In this manner the system logic is performed at efficient low voltage levels, while the output is driven from an external source. This solution is viable, however the size and complexity of the overall design is increased considerably. A second typical solution is to use an integrated circuit process that is capable of laying down thick as well as thin gate oxides. This enables low voltage as well as high voltage transistors to be laid down on the same substrate. However, this alteration of the original fabrication process is prohibitively expensive in many applications. Further, both of these solutions suffer from another problem in that something external to the desired integrated circuit fabrication process must be added to the final design. In extreme environment applications (i.e. high temperature, low temperature, high radiation, high pressure, corrosive, etc.) this is not always acceptable. The integrated circuit fabrication process has been chosen for its temperature, radiation, and pressure characteristics. By adding external devices or altering the fabrication process these required characteristics can be lost.

This invention arose out of a need to develop a low voltage to high voltage logic level shifters that can be fully integrated onto the same substrate as the low voltage logic circuitry that controls it. That is, without altering the fabrication process in any way, this invention creates a means by which to control high is voltage signals that exceed the breakdown voltage of the process used for fabrication.

SUMMARY

Shifter circuits and associated methods are described. In one embodiment, a shifter circuit comprises a high voltage buffer stage, a low voltage buffer stage and an output buffer stage. The high voltage buffer stage comprises multiple transistors arranged in a transistor stack having a plurality of intermediate nodes connecting individual transistors along the stack. The transistor stack is connected between a voltage level being shifted to and an input voltage. The high voltage buffer stage also comprises an inverter comprising multiple inputs and an output. The individual inverter inputs are connected to a respective intermediate node of the transistor stack. The low voltage buffer stage has an input connected to the input voltage and an output, and is operably connected to the high voltage buffer stage. The low voltage buffer stage is connected between a voltage level being shifted away from and a lower voltage. The output buffer stage is driven by the outputs of the high voltage buffer stage inverter and the low voltage buffer stage.

DETAILED DESCRIPTION

Overview

The level shifter circuit described below is particularly well-suited for use in connection with low voltage, deep sub-micron processes, e.g. SOI processes. It is to be appreciated and understood, however, that the described circuit is not limited to SOI contexts. Rather, other types of fabrication processes can be utilized to implement the illustrated circuits, e.g. bulk processes, non silicon processes, and others, as will be appreciated by the skilled artisan. The circuit about to be described carries with it advantages that include the ability to readily lend itself to cascading of multiples of this device, to shift any input signal up to any control level.

Additionally, it is to be appreciated and understood that the scope of this design is not restricted to shifting to only one level at a time. Rather, the level shifter circuit can be configured such that multiple levels can be shifted to simultaneously. Further advantages are achieved insofar as the circuit about to be described has a fairly simplified layout. In at least some embodiments, by not using differential pairs, or any special devices that have higher than normal breakdown voltages, the consistency of this device across a wide process deviation can be ensured.

As well, it is to be appreciated and understood that the operation of this design is not restricted by the physical breakdown voltage limitations imposed by the process used for fabrication. That is, these devices are capable of shifting and controlling logic levels that exceed the rated breakdown voltage of the process used for fabrication. This invention can be implemented, by way of example and not limitation, in such a way as to generate 28 volt output signals, while having been fabricated in a process that breaks down at only 2.5 volts.

Figure 1:
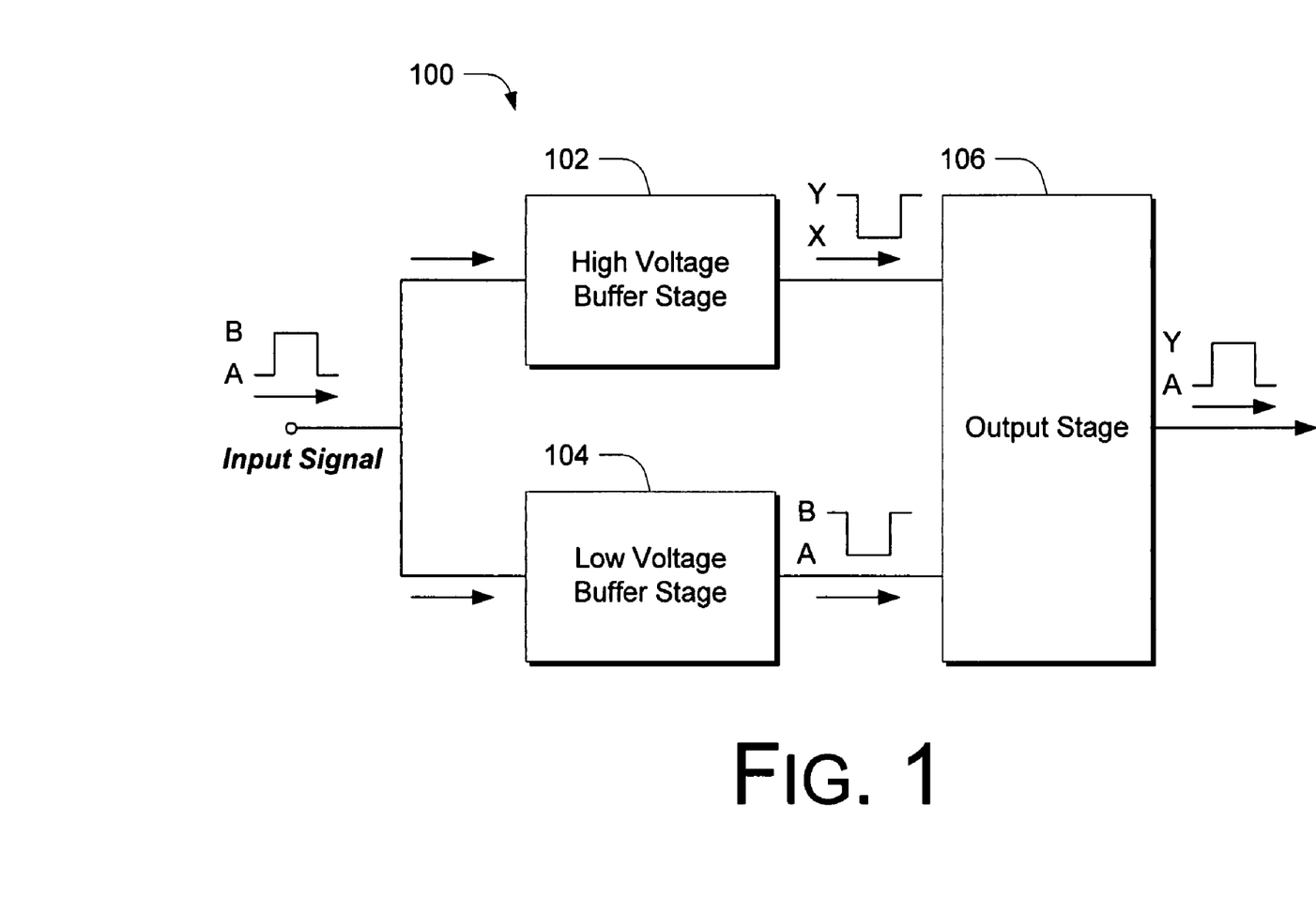
FIG. 1 is a high block diagram of a circuit in accordance with one embodiment.

Turning attention now to FIG. 1, an exemplary block diagram of a low voltage to high voltage level shifter circuit, in accordance with one embodiment, is shown generally at 100. Circuit 100 comprises, in this example, a high voltage buffer stage 102, a low voltage buffer stage 104 and an output stage 106.

The high and low voltage buffer stages 102, 104 receive an input signal, generate control signals, and drive output stage 106. Output stage 106 then drives a load at the output level for which the designed is configured. More specifically, in this example, the input signal resides between two arbitrary logic levels designated as A and B, and high voltage buffer stage 102 performs the logic level shifting up to the level for which the circuit is designed—in this example level Y Low voltage buffer stage 104 is utilized as an inverter, as will be appreciated by the skilled artisan. As will be discussed below, low voltage buffer stages can be cascaded to meet certain timing requirements that are driven by the high voltage buffer stage, as well as to achieve a signal orientation to match the orientation of the high voltage buffer, as will be appreciated by the skilled artisan.

Output stage 106, in this example, is configured as an inverter that is driven by two separate control signals—the high voltage control signal produced by the high voltage buffer stage 102, and the low voltage control signal produced by the low voltage control stage 104—to produce the desired high voltage output signal or logic level.

Stages 102, 104 and 106 can take on differing forms, depending on the particular environments in which they are employed, as will be discussed below.

Exemplary Low Voltage to High Voltage Level Shifter Circuit

Figure 2:
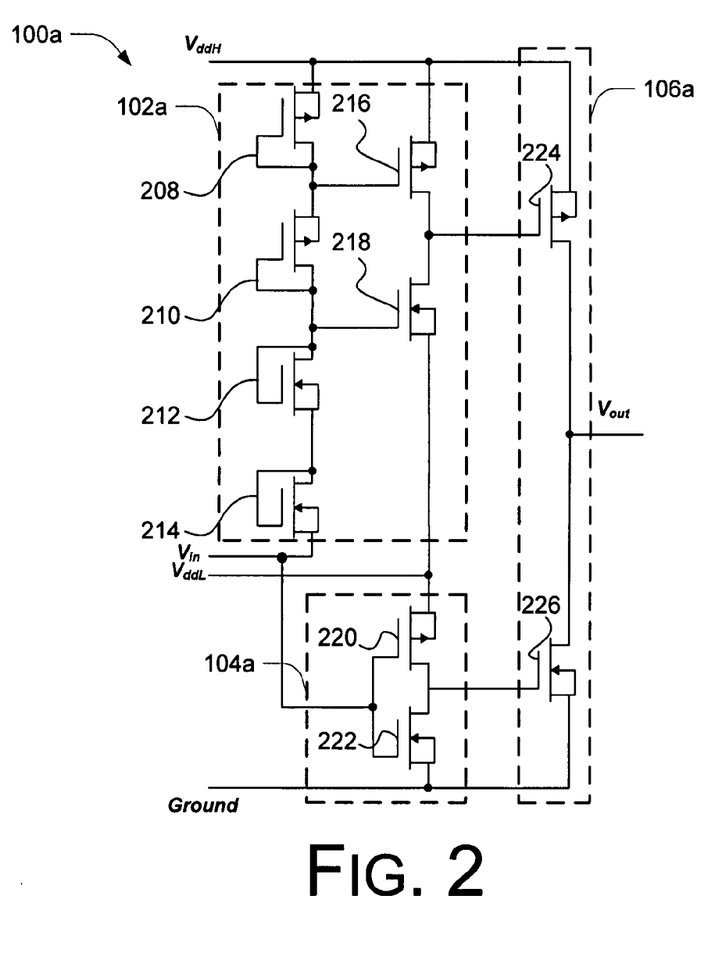
FIG. 2 is a schematic diagram that illustrates the circuit of FIG. 1 in accordance with one specific implementation example.

FIG. 2 shows an exemplary low voltage to high voltage level shifter circuit in accordance with one embodiment, generally at 100a. Like numerals from the FIG. 1 example have been used where appropriate, with differences being indicated with the suffix "a". Accordingly, circuit 100a comprises a high voltage buffer stage 102a, a low voltage buffer stage 104a and an output stage 106a.

High voltage buffer stage 102a comprises, in this example, transistors in the form of MOSFETs 208, 210, 212, 214, 216 and 218. In this particular example, each transistor has its source tied to the bulk contact. This is because the circuit is implemented using an SOI process. As noted above, however, such need not necessarily be the case. Hence, in other implementations, the source/bulk connection need not be made.

In this particular implementation, transistors 208, 210 and 216 are p-channel devices, where 208 and 210 have their gates tied to their respective drains. Similarly, transistors 212, 214 and 218 are n-channel devices, where 212 and 214 have their gates tied to their respective drains. Such gate-drain arrangement, as will be appreciated by the skilled artisan, constitutes a diode connection. Transistors 208, 210, 212 and 214 constitute a transistor stack having intermediate nodes interconnecting the transistors, as will become apparent.

Transistor 208 is connected by its drain to the source of transistor 210. The connection between these transistors constitutes an intermediate node which, in this example, is connected to the gate of transistor 216. Transistor 210 has its drain connected to the drain of transistor 212 which constitutes another intermediate node which, in this example, is connected to the gate of transistor 218. Transistor 212 has its source connected to the drain of transistor 214 which, in turn, constitutes another intermediate node.

The sources of transistors 208 and 216 are tied to $V_{ddH}$, which is the level to which the circuit is shifting. The source of transistor 214 is tied to input signal $V_{in}$, which is used to selectively turn transistors 216 and 218 on and off as will be discussed below. The source of transistor 218 is tied to $V_{ddL}$, which is the level from which the circuit is shifting away.

The output of the high voltage buffer stage, taken from the node connecting the drains of transistors 216, 218 is connected to the gate of transistor 224 in the output stage 106a.

Low voltage buffer stage 104a comprises, in this example, transistors 220 and 222. The source of transistor 220 is connected to the source of transistor 218 in the high voltage buffer stage 102a which, in turn, is tied to $V_{ddL}$, the level away from which the shift occurs. The gates of transistors 220 and 222 are tied together and connected to $V_{in}$. The output of the low voltage buffer stage 104a is connected to the gate of transistor 226 in the output stage 106a. The output of output stage 106a, $V_{out}$, is taken from the node connecting the drains of transistors 224 and 226 and is used to drive a desired load.

In Operation

In operation, when the input signal $V_{in}$ rises, it causes all of the intermediate node voltages of the transistor stack (i.e. transistors 208, 210, 212 and 214) to rise. Alternately, when the input signal $V_{in}$ falls, it causes all of the intermediate node voltages of the transistor stack to fall. This rising and falling of the node voltages generates control signals that selectively turn transistors 216 and 218 on and off. Specifically, when $V_{in}$ is high, all of the intermediate node voltages rise high enough such that transistor 216 is turned off and transistor 218 is turned on. Thus, the voltage of the intermediate node between transistors 210 and 212 is used to drive transistor 218 which, in turn, is used to drive transistor 224 in the output stage 106. When $V_{in}$ is low, on the other hand, the intermediate node voltages of the voltage stack move downward such that transistor 216 is turned on and transistor 218 is turned off. Thus, the voltage of the intermediate node between transistors 208 and 210 is used to drive transistor 216 which, in turn, is used to drive transistor 224 in the output stage 224. Because the high voltage buffer stage 102a is tied between $V_{ddH}$ and $V_{ddL}$, the output of the common drain connection between transistors 216, 218 is a pulse that is between $V_{ddL}$ and $V_{ddH}$, the level being shifting to.

Accordingly, the transistor stack of transistors 208, 210, 212 and 214 effectively constitutes an input voltage divider which is tied between the input signal $V_{in}$ and $V_{ddH}$, the level being shifted to. Transistors 216 and 218 constitute an inverting buffer which is driven by two of the intermediate nodes of the voltage divider. Hence, this stage generates an inverted high voltage control signal which is provided to output buffer 106a.

Low voltage buffer stage 104a, in this embodiment, is comprised of a single inverting buffer, which is driven by the input voltage $V_{in}$. This inverting buffer generates an inverted low voltage control signal which, in turn, drives transistor 226 of the output buffer stage 106a.

In accordance with this embodiment, the output buffer stage 106a rectifies the inverted control signals from the high voltage buffer stage 102a and low voltage buffer stage 104a to the original signal orientation, and drives the high voltage output level $V_{out}$ with the required current capability. It is to be appreciated and understood that the described embodiment is not to be limited to any one low voltage level or any one high voltage level. Rather, it can be scaled to arbitrarily high levels and arbitrarily low levels.

Uses of the above-described circuit include, by way of example and not limitation, providing an interface between low voltage integrated circuit technologies and other integrated circuit technologies that operate at higher logic levels. As stated previously, these levels are not fixed, but can vary as application is needed.

Exemplary Cascaded Embodiment

In another embodiment, multiple high voltage buffer stages can be cascaded together to achieve much higher shift up levels. That is, by cascading the high voltage buffers described above, as shown in FIG. 3, significantly higher levels can be achieved.

Figure 3:
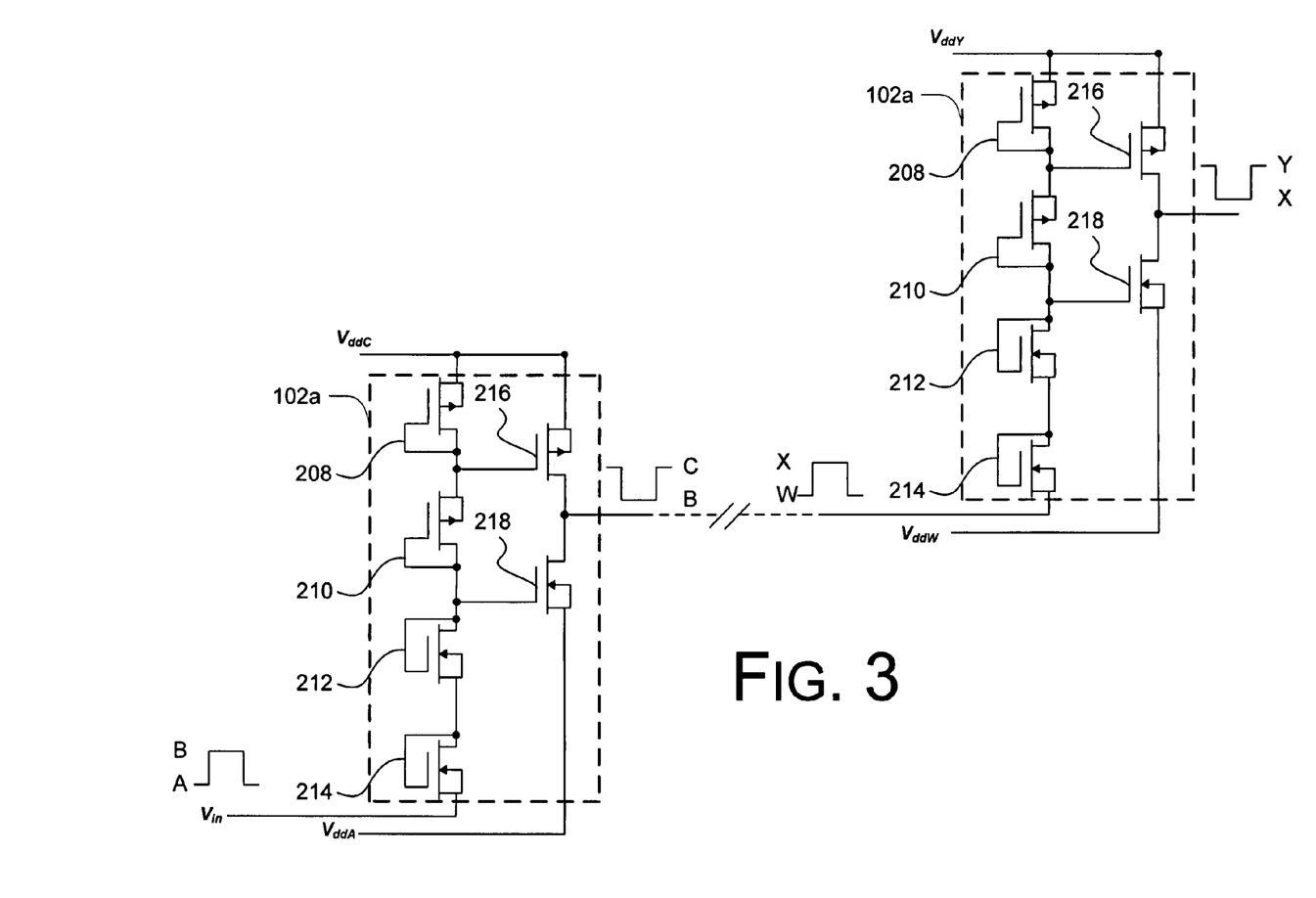
FIG. 3 is a schematic diagram that illustrates the cascading of the high voltage buffer of FIG. 2 in accordance with one embodiment that achieves higher shifting levels.

In the illustrated and described embodiment, the primary level shifting is performed by the high voltage buffer stage 102a. By cascading multiples of this stage, higher control signals can be obtained. That is, as shown in FIG. 3, by tying 19 the output of the first stage, to the input of the second, the input level can be successively shifted up to any desired control level. For example, if the input is a pulse from A–B volts, the first stage can shift this signal up to a pulse from B–C volts, the second stage can shift the signal up to a pulse from C–D volts, and this process can be continued on as far as the specific application requires. These intermediate levels are set by the bias voltages shown in FIG. 3. By adjusting these to the desired values, any shift point can be achieved.

Figure 4:
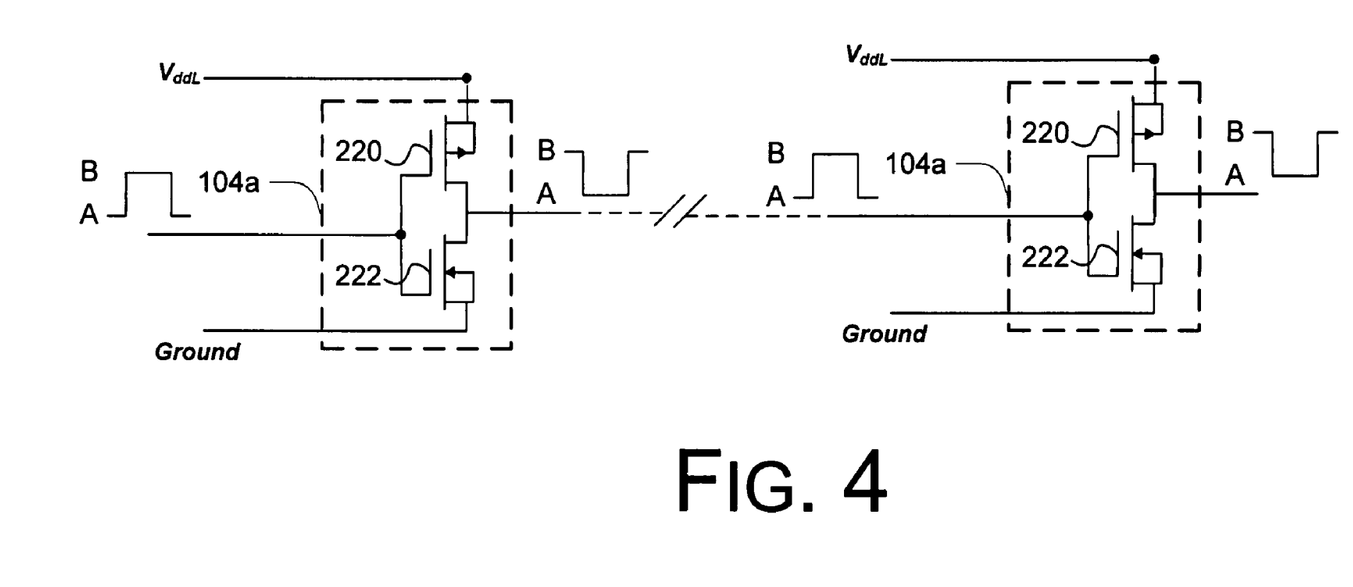
FIG. 4 is a schematic diagram that illustrates the cascading of the low voltage buffer in accordance with one embodiment to achieve higher shifting levels.

The low voltage buffer stage performs the same operation as the low voltage buffer stage does in the non-cascaded embodiment. Here, however, it fulfills a second role. By cascading multiple buffers, as shown in FIG. 4, it ensures that the low voltage control signal and the high voltage control signal both arrive at the output buffer at the same time. That is, as more and more high voltage buffer stages are cascaded together, more of a propagation delay is introduced. Hence, if the output of the high voltage buffer stage significantly lags the output of the low voltage buffer stage, logical errors can be introduced. Accordingly, by cascading low voltage buffer stages, propagation delays introduced by cascaded high voltage buffer stages can be matched and hence, the risk of logical errors mitigated.

In addition, in some instances a significantly large MOSFET might be used in the output buffer stage. In this case, the output buffer might then require a drive circuit. For example, if one attempts to drive several milliamps, e.g., 500 mA, a large MOSFET on the order of 1000 microns×1000 microns might be required. In this situation, the output buffer stage could not be driven by the inverter configuration shown for the outputs of the high voltage and low voltage buffer stages 102a, 104a respectively. Because the output of the high voltage buffer stage is between $V_{ddH}$ and $V_{ddL}$, more standard inverters can be tied between voltage buffers and the output stage to effectively provide a driver. That is, the design described above lends itself readily to driving large loads.

Figure 5:
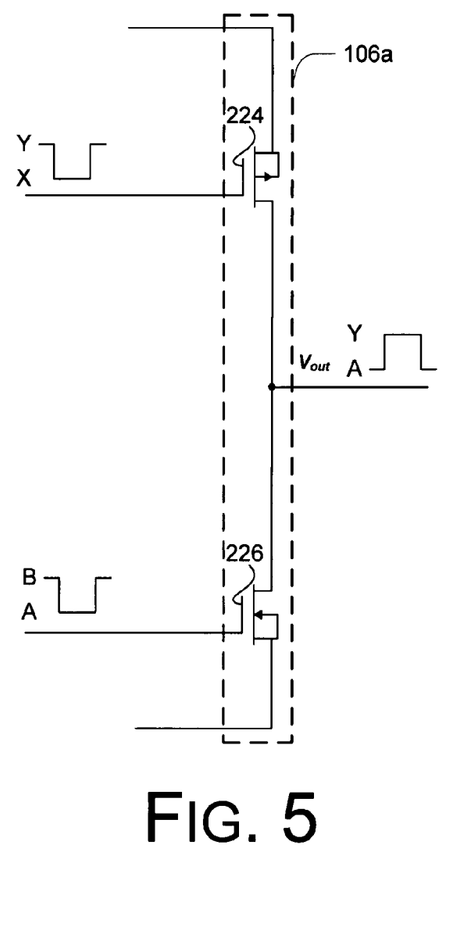
FIG. 5 is a schematic diagram that illustrates the output stage of the cascaded circuit in accordance with one embodiment.

FIG. 5 illustrates the operation of the output buffer stage. Here, two inverted control signals generated by the high and low voltage buffer stages 102a, 104a respectively, are tied to the output stage as shown in FIG. 5. The output stage then generates the final signal that the circuit has been designed to generate.

Figure 6:
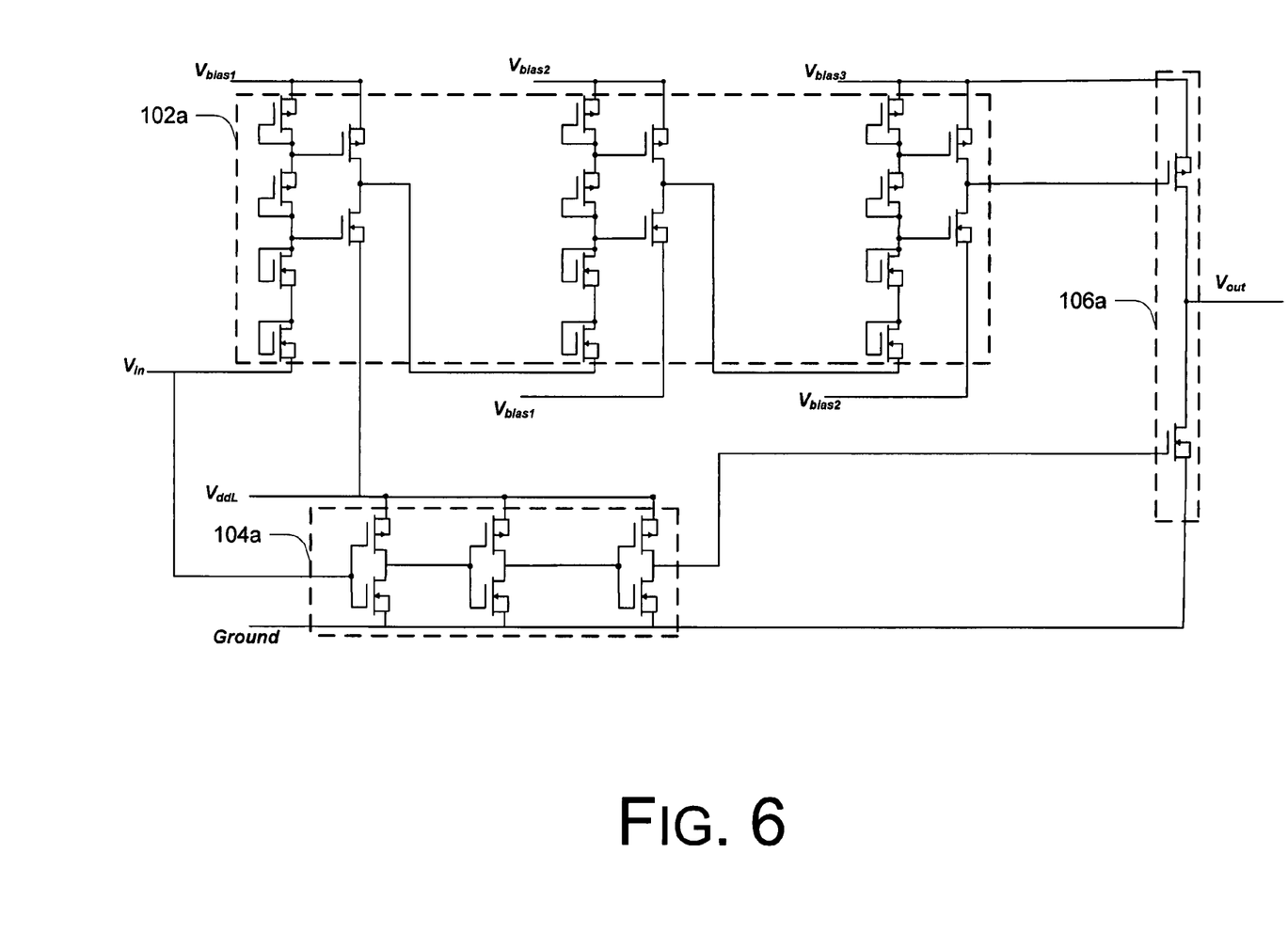
FIG. 6 is a schematic diagram that shows a specific exemplary cascaded circuits that utilizes the circuits of FIGS. 3–5.

FIG. 6 is a schematic diagram that shows a specific exemplary cascaded circuit that utilizes the circuits of FIGS. 3–5.

CONCLUSION

Uses of the above-described circuits include, by way of example and not limitation the following: providing an interface between low voltage integrated circuit technologies and other integrated circuit technologies that operate at higher logic levels, control of electromechanical actuators, control of gas and liquid apertures, control of high pressure propellant apertures, MEMS device control, system-on-chip power management, and power converter feedback and switching. Further, various embodiments find wide use in extreme environment applications, where the processes used for fabrication of the integrated circuits are chosen specifically for their tolerance to environmental variables, not breakdown voltage. As stated previously, the levels used in these specific applications are not fixed, but can vary as application is needed. Further, this embodiment is particularly well suited for shifting to multiple levels simultaneously. As such, in one application scenario, the circuit can be employed in the context of high voltage stacked transistors, in which shifting to multiple levels simultaneously is desired.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. A shifter circuit comprising:
   a high voltage buffer stage comprising:
   multiple transistors arranged in a transistor stack having a plurality of intermediate nodes connecting individual transistors along the stack, the transistor stack being connected between a voltage level being shifted to and an input voltage; and
   an inverter comprising multiple inputs and an output, individual inverter inputs being connected to a respective intermediate node of the transistor stack;
   a low voltage buffer stage having an input connected to said input voltage, and an output, the low voltage buffer stage being operably connected to the high voltage buffer stage and being connected between a voltage level being shifted away from and a lower voltage; and
   an output buffer stage driven by the outputs of the high voltage buffer stage inverter and the low voltage buffer stage.

2. The shifter circuit of claim 1, wherein the transistor stack comprises p-channel and n-channel devices, and wherein the p-channel devices are connected between the n-channel devices and the voltage level being shifted to.

3. The shifter circuit of claim 1, wherein the inverter comprises p-channel and n-channel devices.

4. The shifter circuit of claim 1, wherein the transistor stack comprises p-channel and n-channel devices, and wherein the inverter comprises p-channel and n-channel devices, and wherein one input of the inverter is connected to an intermediate node between two p-channel devices, and another input of the inverter is connected to a intermediate node between a p-channel device and an n-channel device.

5. The shifter circuit of claim 1, wherein the transistor stack comprises p-channel and n-channel devices, and wherein the inverter comprises p-channel and n-channel devices, and wherein one input of the inverter is connected to an intermediate node between two p-channel devices, and another input of the inverter is connected to a intermediate node between a p-channel device and an n-channel device, and wherein the said inverter inputs are connected across at least one common p-channel device.

6. The shifter circuit of claim 1, wherein the transistor stack comprises p-channel and n-channel devices, and wherein the inverter comprises p-channel and n-channel devices, and wherein one input of the inverter is connected to an intermediate node between two p-channel devices, and another input of the inverter is connected to a intermediate node between a p-channel device and an n-channel device, and wherein the input of the inverter's p-channel device is connected to an intermediate node between two p-channel devices.

7. The shifter circuit of claim 1, wherein the transistor stack comprises p-channel and n-channel devices, and wherein the inverter comprises p-channel and n-channel devices, and wherein one input of the inverter is connected to an intermediate node between two p-channel devices, and another input of the inverter is connected to a intermediate node between a p-channel device and an n-channel device, and wherein the input of the inverter's p-channel device is connected to the intermediate node between the two p-channel devices, and wherein the input of the inverter's n-channel device is connected between the intermediate node between the p-channel device and the n-channel device.

8. The shifter circuit of claim 1, wherein the transistors of the transistor stack comprise gate/drain connected MOSFETs.

9. A shifter circuit comprising:
a high voltage buffer stage comprising:
multiple transistor stacks, each of which comprising multiple transistors having a plurality of intermediate nodes connecting individual transistors along a respective stack, each transistor stack being connected between a voltage level being shifted to and an input voltage; and
multiple inverters each of which comprising multiple inputs and an output, each inverter being connected with an individual respective one of the transistor stacks, individual inverter inputs being connected to a respective intermediate node of its connected transistor stack;
a low voltage buffer stage having an input connected to said input voltage and an output, the low voltage buffer stage being operably connected to the high voltage buffer stage and being connected between a voltage level being shifted away from and a lower voltage; and
an output buffer stage driven by the output of a high voltage buffer stage inverter and the output of the low voltage buffer stage.

10. The shifter circuit of claim 9, wherein each transistor stack comprises p-channel and n-channel devices, and wherein the p-channel devices of a stack are connected between the n-channel devices of the stack and the voltage level being shifted to.

11. The shifter circuit of claim 9, wherein said inverters each comprise p-channel and n-channel devices.

12. The shifter circuit of claim 9, wherein said inverters each comprise p-channel and n-channel devices, and wherein, for each transistor stack:
one input of its associated inverter is connected to an intermediate node between two p-channel devices, and
another input of the inverter is connected to a intermediate node between a p-channel device and an n-channel device.

13. The shifter circuit of claim 9, wherein said inverters each comprise p-channel and n-channel devices, and wherein, for each transistor stack:
one input of its associated inverter is connected to an intermediate node between two p-channel devices,
another input of the inverter is connected to a intermediate node between a p-channel device and an n-channel device, and
wherein the said inverter inputs are connected across at least one common p-channel device.

14. The shifter circuit of claim 9, wherein said inverters each comprise p-channel and n-channel devices, and wherein, for each transistor stack:
one input of its associated inverter is connected to an intermediate node between two p-channel devices,
another input of the inverter is connected to a intermediate node between a p-channel device and an n-channel device, and
wherein the input of the inverter's p-channel device is connected to the intermediate node between the two p-channel devices.

15. The shifter circuit of claim 9, wherein said inverters each comprise p-channel and n-channel devices, and wherein, for each transistor stack:
one input of its associated inverter is connected to an intermediate node between two p-channel devices,
another input of the inverter is connected to a intermediate node between a p-channel device and an n-channel device, and
wherein the input of the inverter's p-channel device is connected to the intermediate node between the two p-channel devices, and wherein the input of the inverter's n-channel device is connected between the intermediate node between the p-channel device and the n-channel device.

16. The shifter circuit of claim 9, wherein the transistors of each transistor stack comprise gate/drain connected MOSFETs.

17. The shifter circuit of claim 9, wherein said low voltage buffer stage comprises multiple low voltage buffer stages cascaded together.

18. A method comprising:
supplying a voltage level away from which a shift is desired;
supplying a voltage level to which a shift is desired;
supplying an input voltage; and
shifting the input voltage, using said voltage levels and a circuit comprising:
a high voltage buffer stage comprising:
multiple transistors arranged in a transistor stack having a plurality of intermediate nodes connecting individual transistors along the stack, the transistor stack being connected between the voltage level being shifted to and the input voltage; and
an inverter comprising multiple inputs and an output, individual inverter inputs being connected to a respective intermediate node of the transistor stack;
a low voltage buffer stage having an input connected to said input voltage and an output, the low voltage buffer stage being operably connected to the high voltage buffer stage and being connected between said voltage level being shifted away from and a lower voltage; and
an output buffer stage driven by the outputs of the high voltage buffer stage inverter and the low voltage buffer stage.

19. The method of claim 18, wherein said high voltage buffer stage comprises multiple transistor stacks and multiple inverters, each transistor stack being associated with an inverter.

20. The method of claim 18, wherein said low voltage buffer stage comprises multiple low voltage buffer stages cascaded together.

* * * * *